(12) United States Patent
Chen

(10) Patent No.: US 6,518,507 B1
(45) Date of Patent: Feb. 11, 2003

(54) READILY ATTACHABLE HEAT SINK ASSEMBLY

(75) Inventor: Chun-Chi Chen, Taipei (TW)

(73) Assignee: Hon Hai Precision Ind. Co., Ltd., Taipei Hsien (TW)

(*) Notice: Subject to any disclaimer, the term of this patent is extended or adjusted under 35 U.S.C. 154(b) by 0 days.

(21) Appl. No.: 09/910,306

(22) Filed: Jul. 20, 2001

(51) Int. Cl.[7] .................................................. H05K 1/00
(52) U.S. Cl. ....................... 174/252; 361/688; 257/718; 257/719; 165/80.3; 24/457
(58) Field of Search .......................... 174/252; 361/719, 361/720, 688; 257/718, 719; 24/457; 165/185, 80.2, 80.3

(56) References Cited

U.S. PATENT DOCUMENTS

| | | | | |
|---|---|---|---|---|
| 5,331,507 A | * | 7/1994 | Kyung et al. | 361/720 |
| 5,386,338 A | * | 1/1995 | Jordan et al. | 361/704 |
| 5,464,054 A | * | 11/1995 | Hinshaw et al. | 165/80.3 |
| 5,615,735 A | * | 4/1997 | Yoshida et al. | 165/80.3 |
| 5,896,270 A | * | 4/1999 | Tsui | 361/704 |
| 5,990,552 A | * | 11/1999 | Xie et al. | 257/718 |
| 6,175,499 B1 | * | 1/2001 | Adams et al. | 361/704 |
| 6,208,517 B1 | * | 3/2001 | Prince et al. | 361/704 |
| 6,229,703 B1 | * | 5/2001 | Lee | 361/704 |
| 6,344,971 B1 | * | 2/2002 | Ju | 361/704 |

* cited by examiner

Primary Examiner—David L. Talbott
Assistant Examiner—I B Patel
(74) Attorney, Agent, or Firm—Wei Te Chung

(57) ABSTRACT

A heat sink assembly (10) comprises a heat sink (20) and a clip (30). The heat sink has a base (21) and a plurality of fins (23) extending therefrom. A central receiving groove (25) is defined between two rows of fins. A pair of opposing ridges (24) is formed on each pair of opposing fins which straddle the groove. The clip comprises a main body (31) and opposite legs (38) extending therefrom. The main body has three integrally connected frames (32, 34, 36). Two outer frames are coplanar, and a plane of an intermediate frame is offset away from a plane of the outer frames at an acute angle. The frames are interferentially held in the groove between the ridges, fins and the base. The legs extend in different directions such that the clip is broadly Z-shaped when viewed from above, and broadly V-shaped when viewed from a side thereof.

15 Claims, 4 Drawing Sheets

READILY ATTACHABLE HEAT SINK ASSEMBLY

BACKGROUND OF THE INVENTION

1. Field of the Invention

The present invention relates to heat sink assemblies having clips which readily attach a heat sink to a heat-generating electronic device in a computer.

2. Description of Related Art

In a computer, a heat sink is often used to remove heat generated by certain electronic devices such as Central Processing Units (CPUs). A clip is frequently used to attach the heat sink to the electronic device.

Conventional clips frequently cause difficulties during assembly. This is particularly so when a clip is made of stiff metal with a view to tightly securing a heat sink. A tool is thus often required to effect attachment of the clip. The tool is prone to slip and damage the electronic device and components on and around the electronic device. Furthermore, a conventional clip is passive. Therefore if the heat sink is slightly displaced, the clip cannot self-correct to urge the heat sink to return to its original pre-displaced position. Moreover, when a heat sink is subjected to vibration during normal operation or transportation, certain conventional clips are prone to slip relative to the heat sink. This can seriously reduce the stability of a heat sink assembly and the efficiency of heat removal.

Therefore, a superior heat sink assembly is desired to overcome the above-mentioned problems.

SUMMARY OF THE INVENTION

Accordingly, an object of the present invention is to provide a heat sink assembly which has a clip easily and safely attaching a heat sink to an electronic device.

Another object of the present invention is to provide a heat sink assembly which is self-correcting such that when the heat sink is slightly displaced, it is urged to return to its original pre-displaced position.

In order to achieve the objects set out above, a heat sink assembly of the present invention comprises a heat sink and a clip. The heat sink has a base and a plurality of fins extending therefrom. A central receiving groove is defined between two rows of fins. A pair of opposing ridges is formed on each pair of opposing fins which straddle the groove. The clip comprises a main body and opposite legs extending therefrom. The main body has three integrally connected frames. Two outer frames are coplanar, and a plane of an intermediate frame is offset away from a plane of the outer frames at an acute angle. The frames are adapted to be interferentially held in the groove between the ridges, fins and the base of the heat sink. The legs extend in different directions, and are oriented relative to each other such that the clip is broadly Z-shaped when viewed from above, and broadly V-shaped when viewed from a side thereof.

Other objects, advantages and novel features of the invention will become more apparent from the following detailed description when taken in conjunction with the accompanying drawings.

DETAILED DESCRIPTION OF THE INVENTION

Figure 1:
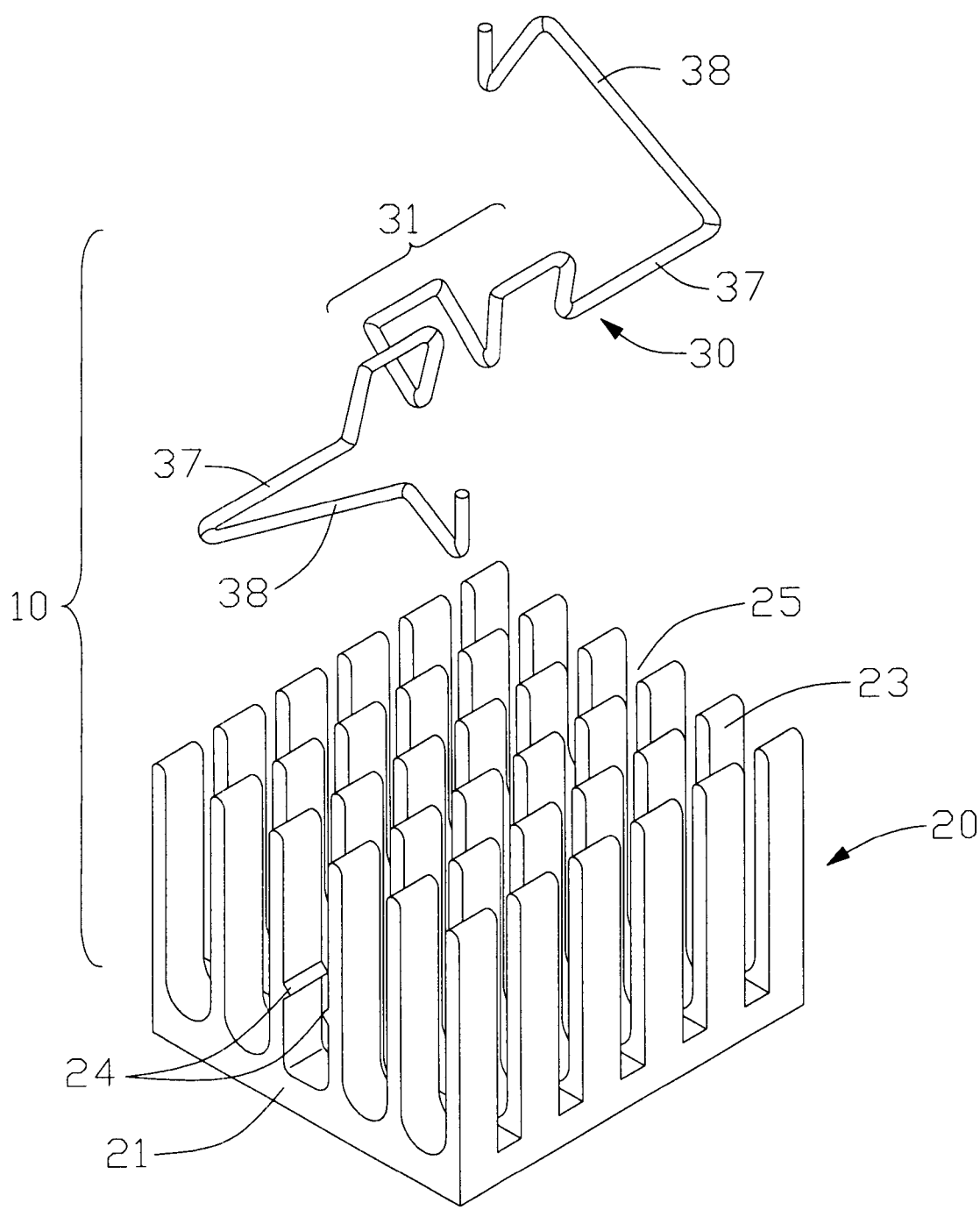
FIG. 1 is an exploded view of a heat sink assembly in accordance with the present invention.

FIG. 1 shows a heat sink assembly 10 in accordance with a preferred embodiment of the present invention. The heat sink assembly 10 includes a heat sink 20 and a wire clip 30.

The heat sink 20 has a base 21, and an array of fins 23 extending upwardly from the base 21. A central receiving groove 25 is defined between two rows of fins 23 from one side of the base 21 to an opposite side of the base 21, for receiving the clip 30. A pair of opposing ridges 24 is formed on lower portions of each pair of opposing fins 23 which straddle the groove 25. The ridges 24 at one side of the groove 25 are aligned, and the ridges 24 at an opposite side of the groove 25 are aligned. All ridges 24 are disposed at a same height on the respective fins 23 above the base 21.

Figure 2:
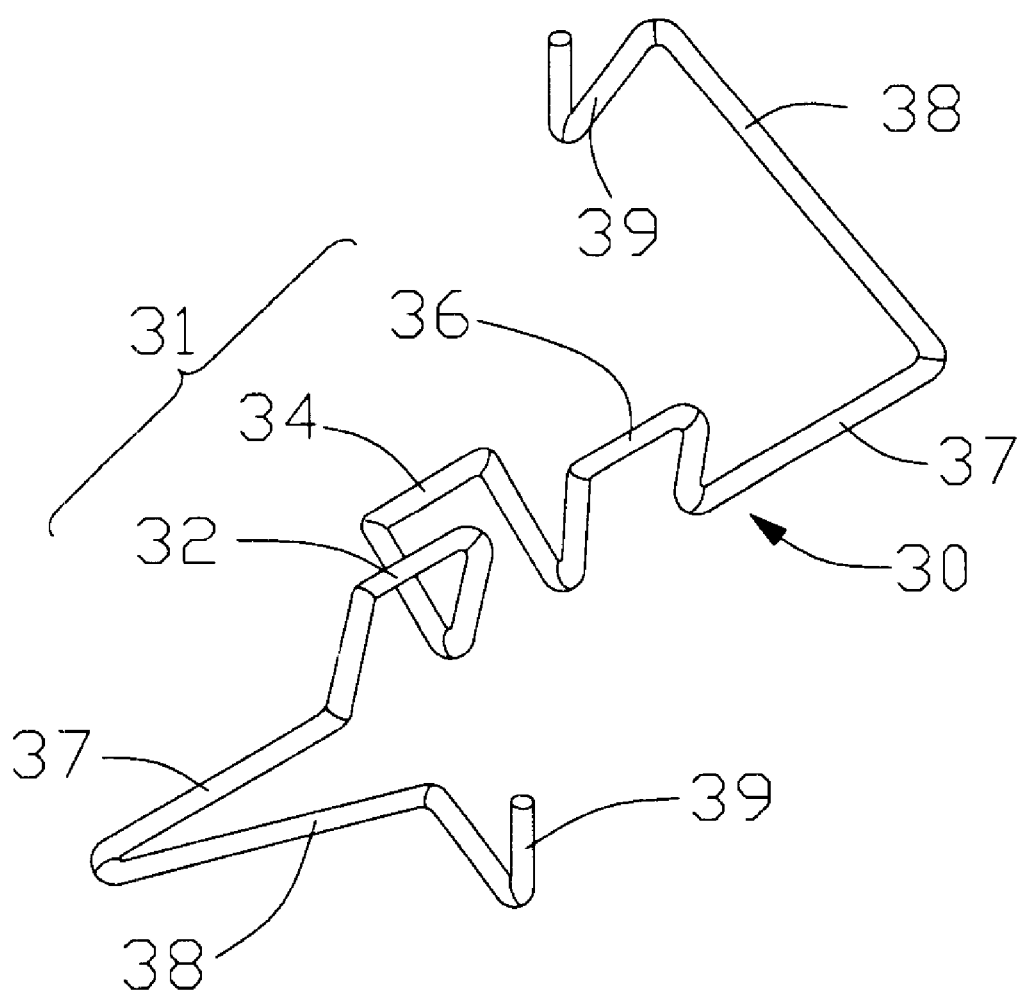
FIG. 2 is a perspective view of a clip of FIG. 1.

Referring to FIG. 2, the clip 30 is made from a single piece of spring wire. The clip 30 comprises a central main body 31, and a pair of legs 38 extending from opposite ends of the main body 31 respectively. The main body 31 comprises three integrally connected U-shaped frames 32, 34 and 36. The frame 34 is disposed between the frames 32 and 36. The frames 32, 36 are coplanar, with the frame 34 being offset away from the plane of the frames 32, 34 at an acute angle. Essentially vertical heights of the frames 32, 34 and 36 are respectively dimensioned to correspond to a height of each ridge 24 above the base 21 of the heat sink 20. A pair of connect portions 37 respectively extend horizontally from opposite ends of the main body 31, collinearly but in opposite directions. A leg 38 extends perpendicularly from a distal end of each connect portion 37. The legs 38 extend in different directions, and are oriented relative to each other such that the clip 30 is broadly Z-shaped when viewed from above (see also FIG. 4), and broadly V-shaped when viewed from a side thereof (see also FIG. 3). A hooked foot 39 extends downwardly and outwardly from a distal end of each leg 38.

Figure 3:
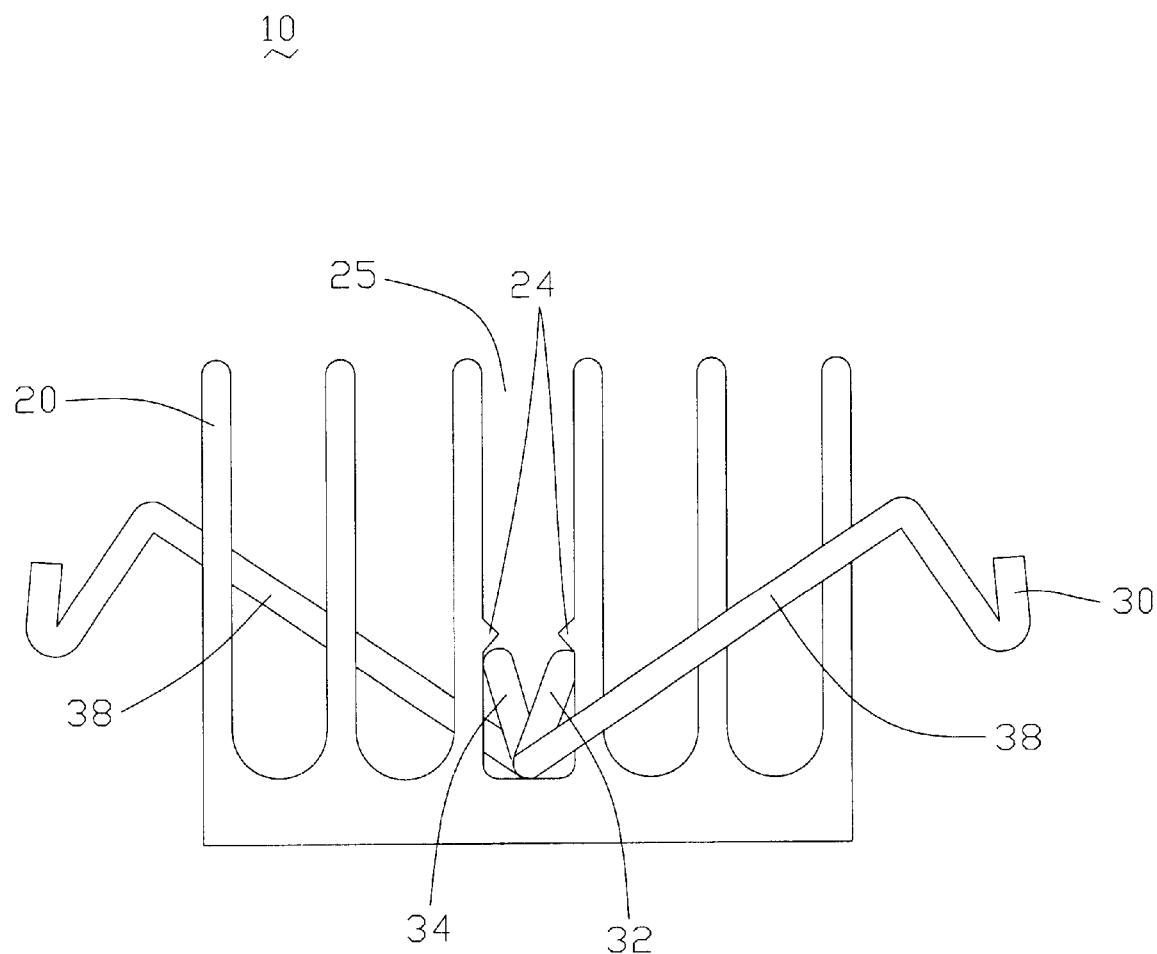
FIG. 3 is an assembled and side elevational view of the heat sink assembly of FIG. 1.

Referring to FIG. 3, the clip 30 is attached to the heat sink 20. The main body 31 of the clip 30 is put into the groove 25 of the heat sink 20 from a top end thereof. The frames 32, 34, and 36 are elastically deformed to slide down over the respective ridges 24 and fittingly sit between the base 21, the respective fins 23 and the respective ridges 24. The frames 32, 34 and 36 remain partly elastically deformed thereat. The main body 31 is thereby resiliently and interferentially held in the groove 25.

Figure 4:
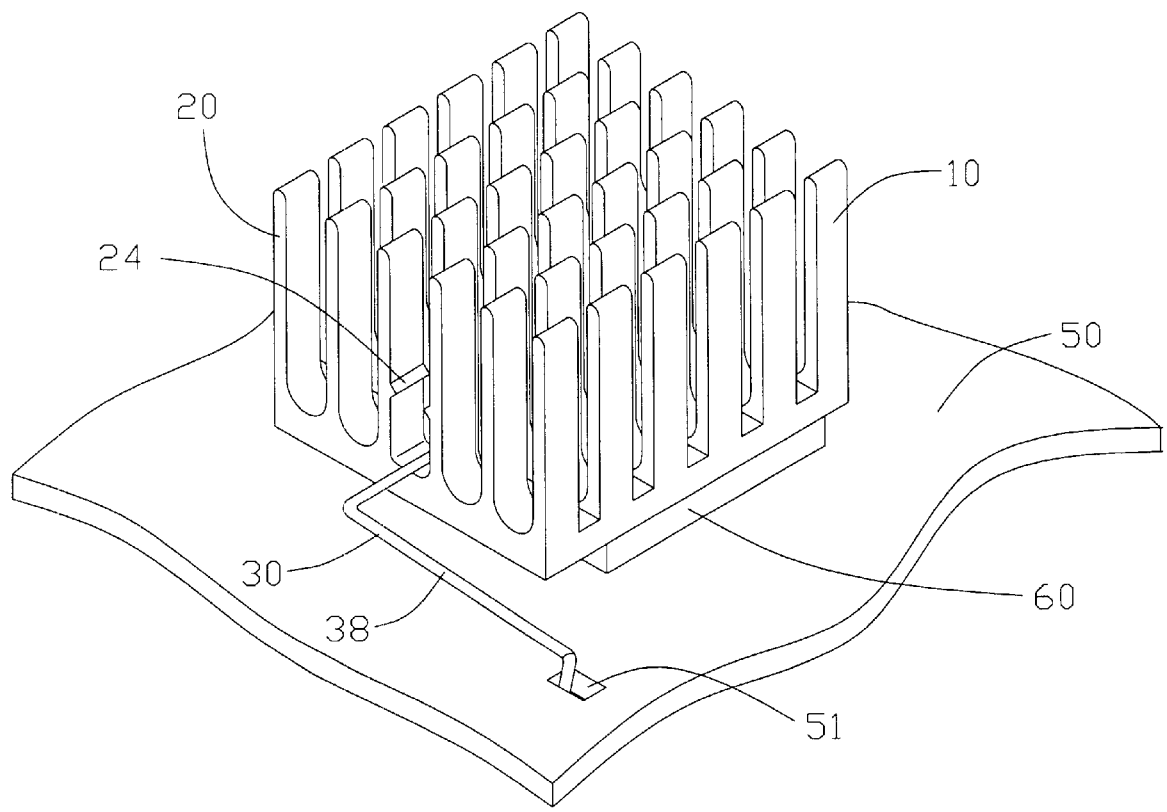
FIG. 4 is a perspective view of the heat sink assembly of FIG. 3 attached to an electronic device mounted on a printed circuit board.

FIG. 4 shows a CPU 60 mounted on a printed circuit board (PCB) 50. A pair of locking holes 51 (only one visible) is defined in the PCB 50 in the vicinity of diagonally opposite corners of the CPU 60. The heat sink assembly 10 is placed on the CPU 60. The legs 38 of the clip 30 are pressed downwardly to urge the feet 39 to enter the holes 51. The feet 39 then resiliently abut against a bottom surface of the PCB 50.

The combined Z-V configuration of the clip 30 enables the clip 30 to act as a torsional spring in both vertical and horizontal directions. If the heat sink 20 is slightly displaced relative to the CPU 60, the clip 30 will accordingly elastically deform and then automatically self-correct by deforming back to its original pre-displaced position. The clip 30 thereby urges the heat sink 20 to return to its original pre-displaced position.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink assembly for dissipating heat generated by an electronic device, the heat sink assembly comprising:
   a heat sink having a base and a plurality of fins extending therefrom, a receiving groove being defined between fins, at least two ridges being formed on at least two fins at opposite sides of the groove; and
   a clip for attaching the heat sink to the electronic device, the clip comprising:
      a main body having at least two frames, a plane of any one frame being offset away from a plane of at least one other frame at an acute angle, the frames being adapted to be interferentially held in the groove between the ridges, fins and the base of the heat sink; and
      a pair of legs extending away from opposite ends of the main body such that the clip is Z-shaped when viewed from above, and V-shaped when viewed from a side thereof.

2. The heat sink assembly as described in claim 1, wherein the clip is made from a single piece of wire.

3. The heat sink assembly as described in claim 1, wherein an essentially vertical height of each frame is dimensioned to correspond to a height of each ridge above the base of the heat sink.

4. The heat sink assembly as described in claim 1, wherein the main body of the clip forms three frames.

5. The heat sink assembly as described in claim 4, wherein two of the frames are coplanar, and are offset away from a plane of the third frame at an acute angle.

6. The heat sink assembly as described in claim 5, wherein the third frame is located between the other two frames.

7. The heat sink assembly as described in claim 1, wherein each leg has a hooked foot at a distal end thereof.

8. A wire clip for attaching a heat sink to an electronic device, comprising:
   a main body having at least two frames, a plane of one frame being offset away from a plane of at least one other frame at an acute angle, the frames being adapted to be interferentially held in a receiving groove of the heat sink under ridges formed on the heat sink; and
   a pair of legs extending away from opposite ends of the main body such that the clip is Z-shaped when viewed from above, and V-shaped when viewed from a side thereof.

9. The clip as described in claim 8, wherein the clip is made from a single piece of wire.

10. The clip as described in claim 8, wherein the main body of the clip forms three frames, and wherein two of the frames are coplanar, and are offset away from a plane of the third frame at an acute angle, the third frame being located between the other two frames.

11. The clip as described in claim 8, wherein each leg has a hooked foot at a distal end thereof.

12. The clip as described in claim 8, wherein a pair of connect portions respectively extends horizontally from opposite ends of the main body to connect to the legs.

13. An electronic device assembly comprising:
   an electronic device mounted on a printed circuit board, a pair of locking holes being defined in the printed circuit board at opposite corners of the electronic device;
   a heat sink for dissipating heat generated by the electronic device, the heat sink having a base engaging with the electronic device and a plurality of fins extending from the base, a receiving groove being defined between fins, at least two ridges being formed on at least two fins at opposite sides of the groove; and
   a clip attaching the heat sink to the electronic device, the clip comprising:
      a main body having at least two frames, a plane of any one frame being offset away from a plane of at least one other frame at an acute angle, the frames being interferentially held in the groove between the ridges, fins and the base of the heat sink; and
      a pair of legs extending away from opposite ends of the main body, each leg having a hooked foot at a distal end thereof engaging in a corresponding locking hole of the print circuit board.

14. The electronic device assembly as described in claim 13, wherein the clip is Z-shaped when viewed from above, and V-shaped when viewed from a side thereof.

15. An electrical device assembly comprising:
   a printed circuit board defining a pair of retention holes;
   an electrical device mounted on the printed circuit board;
   a heat sink seated upon the electrical device, said heat sink including a base with upstanding fins and defining at least an elongated receiving groove; a one-piece clip with a round cross-section throughout a whole length thereof, attached to the heat sink, said clip including a pair of legs, at two opposite end portions thereof, extending out of the heat sink with distal ends retainably engaged within the corresponding retention holes, respectively, a main body positioned between said pair of legs and received within the receiving groove and abutting against the base, wherein
   said main body further includes a series of frames defining two spaced upper sections away from the main body in a vertical direction, said two spaced upper sections respectively abutting against two opposing portions of the heat sink adjacent to said receiving groove under an inward compression condition.

* * * * *